United States Patent [19]

Pasch et al.

[11] Patent Number: 5,681,779
[45] Date of Patent: Oct. 28, 1997

[54] METHOD OF DOPING METAL LAYERS FOR ELECTROMIGRATION RESISTANCE

[75] Inventors: Nicholas F. Pasch, Pacifica; Ratan Choudhury, Milpitas, both of Calif.

[73] Assignee: LSI Logic Corporation, Milpitas, Calif.

[21] Appl. No.: 192,228

[22] Filed: Feb. 4, 1994

[51] Int. Cl.$^6$ .............................. H01L 21/44; H01L 21/48
[52] U.S. Cl. ................ 437/198; 437/194; 437/188; 437/246; 437/140
[58] Field of Search .................... 437/198, 194, 437/246, 140, 188

[56] References Cited

U.S. PATENT DOCUMENTS

| | | |
|---|---|---|
| 4,062,720 | 12/1977 | Alcorn et al. . |
| 4,335,506 | 6/1982 | Chiu et al. . |
| 4,489,482 | 12/1984 | Keyser et al. . |
| 4,566,177 | 1/1986 | Van de Ven et al. ............ 29/590 |
| 4,742,014 | 5/1988 | Hooper et al. ............ 437/198 |
| 4,842,891 | 6/1989 | Miyazaki et al. . |
| 5,084,412 | 1/1992 | Nakasaki . |
| 5,110,762 | 5/1992 | Nakahara et al. ............ 437/189 |
| 5,116,783 | 5/1992 | Tsumura . |
| 5,130,274 | 7/1992 | Harper et al. ............ 437/195 |
| 5,391,517 | 2/1995 | Gelatos et al. ............ 437/198 |
| 5,527,730 | 6/1996 | Kayaoka et al. ............ 437/919 |
| 5,527,739 | 6/1996 | Parrillo et al. ............ 437/198 |

FOREIGN PATENT DOCUMENTS 2296333  12/1990  Japan .

*Primary Examiner*—Chandra Chaudhari
*Assistant Examiner*—Lynne A. Garley
*Attorney, Agent, or Firm*—Oppenheimer Poms Smith

[57] ABSTRACT

A method of doping metal layers on integrated circuits to provide electromigration resistance and integrated circuits having metal alloy interconnects characterized by being resistant to electromigration are provided. The process consists of the steps of (1) depositing a film of a pure first conductive metal upon a semiconductor, (2) patterning and etching the deposited film, (3) subjecting the patterned conductive metal film to metallo-organic chemical vapor deposition in order to deposit upon the first deposited metal and not upon any semiconductive areas present in the patterned conductive metal film a doping amount of a second conductive metal different from the first metal, and (4) heating at a temperature sufficient to uniformly diffuse the second metal through the bulk of the patterned first conductive metal film.

23 Claims, No Drawings

METHOD OF DOPING METAL LAYERS FOR ELECTROMIGRATION RESISTANCE

BACKGROUND OF THE INVENTION

1. Field of the Invention

This invention relates to integrated circuits. In one of its more particular aspects this invention relates to an integrated circuit having a doped metal layer which is resistant to electromigration. In another of its more particular aspects this invention relates to a method of doping such metal layers.

2. Description of Relevant Art

In the fabrication of integrated circuits it is frequently necessary to selectively provide metal layers upon semiconductors. One of the problems associated with such metal layers is the tendency of electromigration of the metal, which may adversely affect the integrity of semiconductor devices incorporating the metal layers, particularly where the metal layers form part of an integrated circuit.

The undesirable effects of electromigration in integrated circuits, due to high current flow through electrical conductors, are well known in the industry. The problem is particularly prevalent in the case of aluminum and other metal conductors. In fact, the use of aluminum for metallization is possible today largely because aluminum films can be doped with low concentrations of elements which inhibit electromigration. The most common elements used for this purpose are silicon and copper in concentrations below about 5% by weight. Silicon, however, exhibits several undesirable effects. Its use as a dopant consequently is being phased out as quickly as possible. Copper is a powerful inhibitor of electromigration, but there are several problems connected with its use in normal processing. One of the most serious problems is the difficulty of patterning copper-doped aluminum films with standard plasma etching machinery and methods. The copper chlorides formed during chlorine plasma etching, for example, inhibit further etching. Another problem resides in the electrochemical corrosion of copper-doped aluminum films after plasma etching has been completed. Furthermore, there are no easily formed and sublimable compounds of copper to facilitate the removal of copper following plasma etching of copper-doped aluminum films. Where the plasma etching of aluminum is accomplished by the use of halogens, the halogenated compounds formed during etching are hygroscopic and very acidic. Water absorption results in the formation of acid puddles which corrode the aluminum-copper alloy comprising the copper-doped aluminum films.

It would therefore be desirable to provide a method for doping metal films which avoids etching and corrosion problems.

SUMMARY OF THE INVENTION

In accordance with the invention, doped metal layers having resistance to electromigration are provided for integrated circuit structures. The doped metal layers of the present invention are formed by a process which comprises the steps of (1) depositing a film of a pure first conductive metal upon a semiconductor, (2) patterning and etching the deposited film, (3) subjecting the patterned conductive metal film to metallo-organic chemical vapor deposition in order to deposit a doping amount of a second conductive metal different from the first metal in the deposited conductive metal film, and (4) heating the conductive metal film upon which has been deposited a doping amount of the second conductive metal at a temperature sufficient to uniformly diffuse the second metal through the bulk of the patterned first conductive metal film. Step 3 is effective to deposit the second conductive metal only upon the first deposited metal and not upon any semiconductor areas present in the patterned and etched structure.

Because the patterning and etching are carried out before the dopant metal is deposited upon the conductive metal film, problems caused by patterning and etching of a doped metal film are avoided. Furthermore, doping of the conductive metal film is effective to reduce the tendency for electromigration of the metal lines of integrated circuits which utilize the doped conductive metal.

DESCRIPTION OF EXEMPLARY EMBODIMENTS

The electromigration resistance of the doped metal layers in the integrated circuit structures of the present invention is provided by a process in which the dopant is applied subsequent to patterning and etching of the integrated circuit structure. That is, a conductive metal layer, such as a film of pure aluminum, is deposited upon the semiconductive oxide surface of the integrated circuit and then patterned and etched prior to application of the dopant. Thus the dopant is deposited upon the patterned and etched aluminum film rather than, as previously, over the entire integrated circuit surface. Doping subsequent to patterning offers the advantage of not having to pattern and etch a doped metal, which previously caused problems due to the presence of the dopant. For example, where the dopant is copper, the etching process resulted in the formation of copper compounds which detracted from the stability of the integrated circuit. Where the etchant used was a halogen, for example, the etching process produced copper halides which are known to be acidic as well as being hygroscopic. The hygroscopicity of such compounds resulted in the formation of acid puddles upon being exposed to air. This was undesirable because the acid thereby produced corrodes the aluminum copper alloy metal lines. Where the copper dopant is deposited subsequent to patterning the problem of the acidity of copper halides is avoided. However, the deposition of a copper dopant upon a patterned aluminum film should be limited to the parts of the integrated circuit surface in which the aluminum lines are present. That is, the semiconductive surfaces of the integrated circuit should not have copper deposited upon them. Dopant deposition processes previously used resulted in the deposition of dopant over the entire surface exposed to the dopant.

An improvement provided by the present invention resides in the selectivity of metallo-organic chemical vapor deposition to metal surfaces. Thus, upon exposing the integrated circuit containing the patterned aluminum film to a metallo-organic chemical vapor deposition process copper is deposited upon only the aluminum surfaces and not upon the semiconductor present in the integrated circuit structure. This provides a marked advantage in that removal of deposited copper from semiconductive surfaces is not required. In the process of the present invention the patterned aluminum film having copper deposited upon it by means of a metallo-organic chemical vapor deposition process can be heated at a high enough temperature to uniformly diffuse the copper throughout the bulk of the aluminum film. Electromigration resistance is thereby incorporated into the aluminum-copper alloy lines, resulting in integrated circuit structures which are considerably more stable than previously available structures.

Although the use of aluminum as the metal film and copper as the dopant are preferred, it is possible to utilize other metal films and other dopants. Where aluminum is used as the metal film, other dopants which can be used include tungsten and zinc. In place of aluminum, copper can be used as the metal film and tungsten can be used as the dopant for producing electromigration resistance in the doped metal lines of the integrated circuit. For purposes of illustration the subsequent discussion will be directed to the use of an aluminum film and a copper dopant, although, as pointed out above, other films and other dopants can be used as well.

The first step in the process of the present invention is to deposit a film of pure aluminum upon a semiconductor to provide a conductive metal film which can be patterned and etched to produce a desired interconnect pattern upon the semiconductor. Aluminum can be deposited by any convenient method such as sputtering or evaporation. Other methods may be used as well. The aluminum film can be deposited to any desired thickness. Especially preferred are films which are about 1,000 angstroms to 2.5 microns in thickness. It is generally convenient to conduct the deposition by a sputter deposition processes such as those known in the semiconductor fabrication art.

The second step in the process is patterning and etching the deposited pure aluminum film. The patterning and etching of the pure aluminum film is accomplished by any suitable etching technique, for example, by use of photoresist masks. It is preferred to use halogen etchants for purposes of convenience and to reduce the possibility of adverse and corrosive reactions where acid etchants, for example, are used. Since patterning and etching are processes well known, they will not be further described herein.

The third step in the process is subjecting the patterned aluminum film to a metallo-organic chemical vapor deposition (MOCVD) process to deposit a very small quantity of copper on the aluminum metal lines formed during the patterning and etching step.

The MOCVD process utilizes an organo-metallic compound, for example, copper hexafluoroacetyl acetonate or a derivative thereof. Other organo-metallic compounds can be used as well. The organo-metallic copper compound is flowed into a chamber in a quantity so that the amount of copper in the resulting doped metal film is in the range of about one percent to five percent by weight of the metal film. The metallo-organic chemical vapor deposition process can be carried out in a typical MOCVD apparatus at a temperature in the range of about 250° C. to 500° C. and at a pressure which is typically less than one atmosphere. Preferably, pressures of less than about 100 torrs are utilized.

The final step in the process is treating the patterned aluminum film having copper deposited upon it at a high enough temperature to uniformly diffuse the copper throughout the bulk of the patterned aluminum film. For this purpose temperatures of about 350° C. to 500° C. are utilized. Preferably, temperatures of about 350° C. to 450° C. are used to provide the required degree of diffusion.

The process of the present invention avoids the major problems confronting the use of aluminum-copper alloy interconnects in integrated circuits. The various advantages described above are realized by the general process of using an MOCVD process for doping a metal film subsequent to patterning. Thereby, numerous problems associated with the patterning and passivation of electrochemically active films are avoided.

Having thus described the invention, what is claimed is:

1. A process for forming doped metal conductive areas upon a semiconductive surface which comprises the steps of:
   (a) depositing a covering film of a first conductive metal upon a semiconductive surface;
   (b) etching said covering film to remove portions of said covering film and exposing portions of said semiconductive surface, and providing a pattern of remaining first conductive metal;
   (c) depositing a second conductive metal in a doping amount upon all of said pattern of remaining first conductive metal without depositing said second conductive metal upon said exposed portions of said semiconductive surface where said pattern of remaining first conductive metal is not present; and
   (d) heating the structure resulting from steps (a)–(c) to diffuse said second conductive metal throughout said remaining first conductive metal.

2. The process of claim 1 wherein said first conductive metal is aluminum and said second conductive metal is copper.

3. The process of claim 1 wherein said first conductive metal is aluminum and said second conductive metal is tungsten.

4. The process of claim 1 wherein said first conductive metal is aluminum and said second conductive metal is zinc.

5. The process of claim 1 wherein said first conductive metal is copper and said second conductive metal is tungsten.

6. The process of claim 1 wherein said film of said first conductive metal is deposited by sputtering.

7. The process of claim 1 wherein said film of said first conductive metal is deposited by evaporation.

8. The process of claim 1 wherein said film of said first conductive metal is deposited to a thickness of about 1000 Angstroms to 2.5 microns.

9. The process of claim 1 wherein said second conductive metal is deposited by metallo-organic chemical vapor deposition.

10. The process of claim 9 wherein said metallo-organic chemical vapor deposition utilizes copper hexafluoroacetyl acetonate.

11. The process of claim 9 wherein said metallo-organic chemical vapor deposition is conducted at a pressure of about 100 torrs to less than 1 atmosphere.

12. The process of claim 1 wherein said second conductive metal is present in a concentration of about 1% to 5% by weight of said first conductive metal.

13. The process of claim 1 wherein the step of depositing said second conductive metal is conducted at a temperature of about 250° to 500° C.

14. A process for forming aluminum-copper alloy interconnect lines on an integrated circuit which comprises the steps of:
   (a) depositing a substantially pure aluminum film onto a semiconductive surface of an integrated circuit;
   (b) etching said aluminum film to remove portions of said aluminum film and expose portions of said semiconductive surface while also providing a selected pattern of remaining aluminum film;
   (c) depositing copper in a doping amount upon all of said remaining aluminum film without depositing any copper upon portions of said exposed semiconductive surface wherein aluminum film is not present; and
   (d) heating the structure resulting from steps (a)–(c) to diffuse copper throughout said aluminum film, thus providing said aluminum-copper alloy interconnect lines in said selected pattern.

15. The process of claim 14 wherein the copper depositing step is performed by means of metallo-organic chemical vapor deposition.

16. The process of claim 15 wherein said metallo-organic chemical vapor deposition utilizes copper hexafluoroacetyl acetonate.

17. The process of claim 14 wherein said aluminum film is deposited by sputtering.

18. The process of claim 14 wherein said aluminum film is deposited by evaporation.

19. The process of claim 14 wherein said aluminum film is deposited to a thickness of about 1000Angstroms to 2.5 microns.

20. The process of claim 14 wherein said doping amount is about 1% to 5% by weight of said aluminum film.

21. The process of claim 14 wherein copper is deposited at a temperature of about 250° to 500° C.

22. The process of claim 14 wherein said metallo-organic chemical vapor deposition is conducted at a pressure of about 100 torrs to less than about 1 atmosphere.

23. A process for forming aluminum-copper alloy interconnect lines on an integrated circuit which comprises the steps of:

(a) depositing a substantially pure aluminum film which is not aluminum-copper alloy onto a semiconductor surface of an integrated circuit;

(b) etching said aluminum film to remove portions of said aluminum film and to expose portions of said semiconductor surface, while also providing a selected pattern of remaining aluminum film;

(c) depositing copper by metallo-organic chemical vapor deposition in a doping amount upon all of said remaining aluminum film without depositing any copper upon portions of said exposed semiconductor surface wherein aluminum film is not present; and (d) heating the structure resulting from steps (a)–(c) to diffuse copper throughout said remaining aluminum film, to provide said aluminum-copper alloy interconnect lines.

* * * * *